US010699922B2

(12) United States Patent
Ranish et al.

(10) Patent No.: US 10,699,922 B2
(45) Date of Patent: Jun. 30, 2020

(54) LIGHT PIPE ARRAYS FOR THERMAL CHAMBER APPLICATIONS AND THERMAL PROCESSES

(71) Applicant: Applied Materials, Inc., Santa Clara, CA (US)

(72) Inventors: Joseph M. Ranish, San Jose, CA (US); Aaron Muir Hunter, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 739 days.

(21) Appl. No.: 14/727,136

(22) Filed: Jun. 1, 2015

(65) Prior Publication Data

US 2016/0027671 A1    Jan. 28, 2016

Related U.S. Application Data

(60) Provisional application No. 62/028,964, filed on Jul. 25, 2014, provisional application No. 62/036,698, filed on Aug. 13, 2014.

(51) Int. Cl.
*H01L 21/67* (2006.01)
*F21V 8/00* (2006.01)
*G02B 6/00* (2006.01)
*H05B 3/00* (2006.01)

(52) U.S. Cl.
CPC .......... *H01L 21/67115* (2013.01); *G02B 6/00* (2013.01); *G02B 6/0005* (2013.01); *H05B 3/0047* (2013.01)

(58) Field of Classification Search
None
See application file for complete search history.

(56) References Cited

U.S. PATENT DOCUMENTS 3,761,678 A * 9/1973 Eckles ................... H05B 3/009
                                                    219/405
5,155,336 A * 10/1992 Gronet .................. C23C 16/481
                                                    219/390
5,156,820 A * 10/1992 Wong ................... B01J 19/0013
                                                    118/725

(Continued)

FOREIGN PATENT DOCUMENTS

CN        100536063 C       9/2009
CN        102017101 A       4/2011
(Continued)

OTHER PUBLICATIONS

PCT/US2015/035862, dated Aug. 31, 2015, PCT International Search Report and Written Opinion.

(Continued)

*Primary Examiner* — Thor S Campbell
(74) *Attorney, Agent, or Firm* — Patterson + Sheridan LLP

(57) ABSTRACT

A processing chamber is described. The processing chamber includes a chamber having an interior volume, a light pipe array coupled to the chamber, the light pipe array comprising a wall member that defines a boundary of the interior volume of the chamber, wherein the light pipe array includes a plurality of non-metallic light pipe structures, and a radiant heat source comprising a plurality of energy sources in optical communication with each of the plurality of light pipe structures.

19 Claims, 7 Drawing Sheets

(56) References Cited

U.S. PATENT DOCUMENTS

| | | | | |
|---|---|---|---|---|
| 5,215,588 | A | * | 6/1993 | Rhieu ............... C23C 16/45519 118/715 |
| 5,305,417 | A | * | 4/1994 | Najm .................... B24B 37/013 118/724 |
| 5,317,492 | A | * | 5/1994 | Gronet .................. C23C 16/481 313/46 |
| 5,318,362 | A | | 6/1994 | Schietinger et al. |
| 5,444,815 | A | * | 8/1995 | Lee ....................... G01J 5/0003 118/724 |
| 5,487,127 | A | * | 1/1996 | Gronet .................. C23C 16/481 118/50.1 |
| 5,683,173 | A | * | 11/1997 | Gronet .................. C23C 16/481 219/405 |
| 5,689,614 | A | * | 11/1997 | Gronet .................. C23C 16/481 118/725 |
| 5,790,751 | A | * | 8/1998 | Gronet .................. C23C 16/481 219/405 |
| 6,072,160 | A | | 6/2000 | Bahl |
| 6,350,964 | B1 | * | 2/2002 | Boas ................ H01L 21/67115 118/724 |
| 6,434,327 | B1 | * | 8/2002 | Gronet .................. C23C 16/481 219/405 |
| 7,509,035 | B2 | * | 3/2009 | Ranish ............. H01L 21/67115 118/50.1 |
| 7,547,633 | B2 | * | 6/2009 | Ranish ............. H01L 21/67115 438/677 |
| 7,978,964 | B2 | * | 7/2011 | Ranish .................... H01J 65/00 392/407 |
| 8,041,197 | B2 | * | 10/2011 | Kasai ................. H01L 21/2686 392/407 |
| 8,222,570 | B2 | | 7/2012 | Timans |
| 8,314,368 | B2 | * | 11/2012 | Ranish .................. H01L 21/324 118/725 |
| 8,367,983 | B2 | * | 2/2013 | Ranish ............. H01L 21/67115 118/725 |
| 8,457,479 | B2 | | 6/2013 | Kubo |
| 8,536,492 | B2 | * | 9/2013 | Ramamurthy .... H01L 21/67103 219/390 |
| 8,548,311 | B2 | * | 10/2013 | Koelmel .......... H01L 21/67098 392/407 |
| 8,582,962 | B2 | * | 11/2013 | Ranish .................... H01J 65/00 392/407 |
| 8,901,518 | B2 | * | 12/2014 | Ranish .................... F25B 29/00 219/409 |
| 2013/0284095 | A1 | | 10/2013 | Ranish |
| 2014/0027092 | A1 | | 1/2014 | Ranish et al. |

FOREIGN PATENT DOCUMENTS

| | | |
|---|---|---|
| CN | 105264649 A | 1/2016 |
| JP | 2008288598 A | 11/2008 |
| JP | 4918949 B2 | 4/2012 |

OTHER PUBLICATIONS

Taiwan Office Action for Application No. 104124085 dated Dec. 26, 2018.

Chinese Office Action for Application No. 201580036673.5 dated Jul. 30, 2019.

Chinese Office Action for Application No. 201580036673.5 dated Feb. 20. 2020.

* cited by examiner

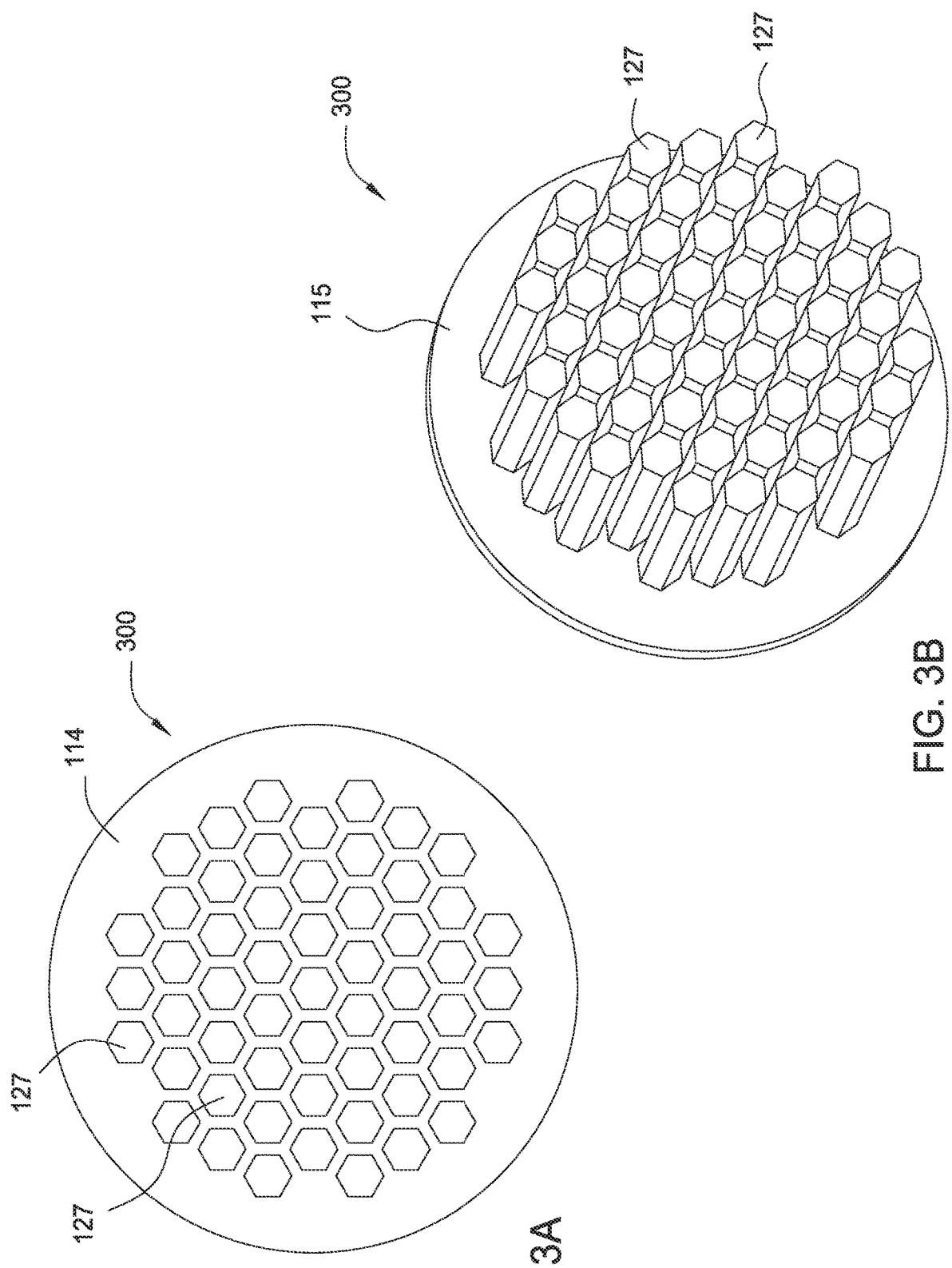

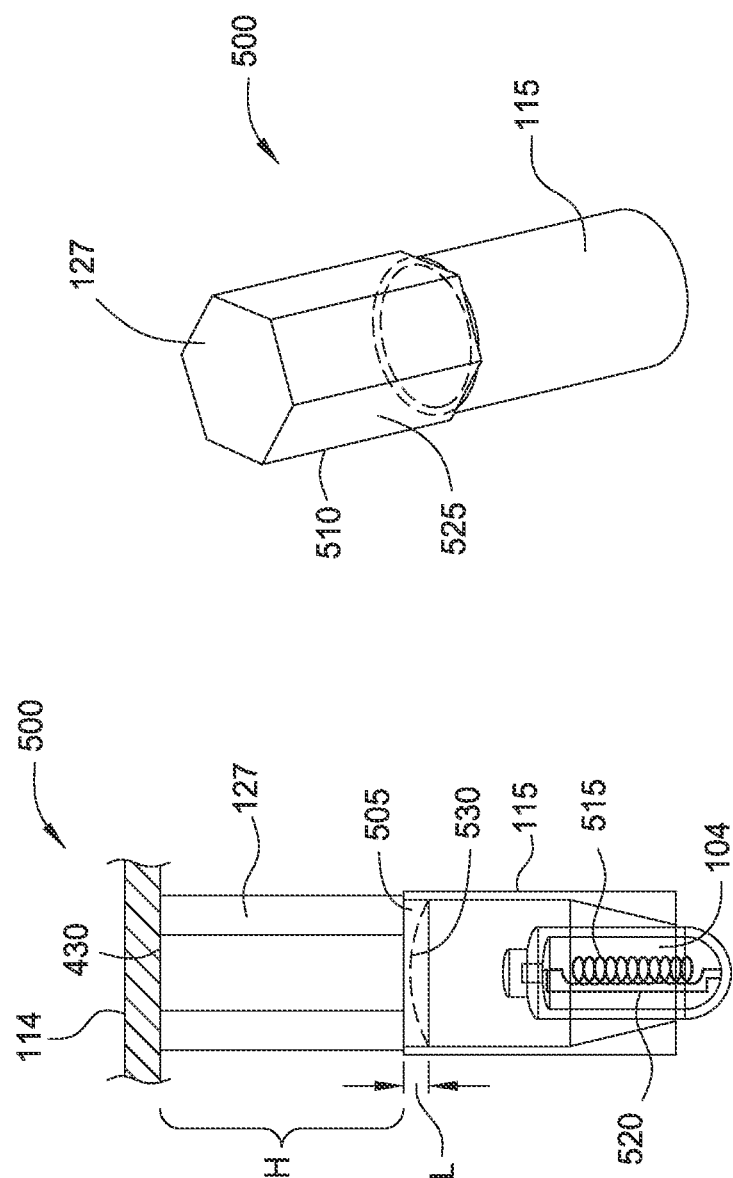

LIGHT PIPE ARRAYS FOR THERMAL CHAMBER APPLICATIONS AND THERMAL PROCESSES

CROSS-REFERENCE TO RELATED APPLICATION

This application claims benefit of U.S. Provisional Patent Application Ser. No. 62/028,964 filed Jul. 25, 2014 and U.S. Provisional Patent Application Ser. No. 62/036,698 filed Aug. 13, 2014, which are both incorporated herein by reference.

FIELD

Apparatus and methods for semiconductor processing are disclosed herein. More specifically, embodiments disclosed herein relate to light pipes for thermal processing of semiconductor substrates.

BACKGROUND

Thermal processing is commonly practiced in the semiconductor industry. Semiconductor substrates are subjected to thermal processing in the context of many transformations, including deposition, doping, activation, and annealing of gate source, drain, and channel structures, siliciding, crystallization, oxidation, and the like. Over the years, techniques of thermal processing have progressed from simple furnace baking, to various forms of increasingly rapid thermal processing (RTP), spike annealing, as well as other thermal processes.

As the critical dimensions of semiconductor device features continue to shrink, more stringent constraints on thermal budgets are required during thermal processes. Many of the aforementioned thermal processes utilize lamp heating in the form of a lamphead consisting of a plurality of light sources positioned to direct radiant energy toward a substrate. However, the irradiance pattern of the light sources is sometimes irregular in conventional lampheads, which creates irregular heating of the substrate.

What is needed is a method and apparatus that enables improved radiance control of the lamphead within a thermal process chamber.

SUMMARY

Embodiments disclosed herein relate to a light pipe array for use in thermal processing of semiconductor substrates.

In one embodiment, a light pipe array for use in a thermal processing chamber is provided. The light pipe array comprises a transparent wall member; and a plurality of nonmetallic light pipe structures disposed adjacent a major surface of the wall member, each of the plurality of light pipe structures comprising a transparent material and having a longitudinal axis, at least a portion of the plurality of light pipe structures being positioned with the longitudinal axis in a substantially orthogonal relation to a plane of the major surface of the wall member.

In another embodiment, a substrate processing chamber is provided. The processing chamber includes a chamber having an interior volume, a radiant heat source comprising a plurality of energy sources, and a light pipe array coupled between the chamber and the radiant heat source, the light pipe array comprising a plurality of light pipe structures in optical communication with a respective energy source.

In another embodiment, a substrate processing chamber is provided. The processing chamber includes a chamber having an interior volume, a light pipe array coupled to the chamber, the light pipe array comprising a transparent wall member, a plurality of light pipe structures disposed adjacent a major surface of the wall member, each of the plurality of light pipe structures comprising a transparent material and having a longitudinal axis, at least a portion of the plurality of light pipe structures being positioned with the longitudinal axis in a substantially orthogonal relation to a plane of the major surface of the wall member, and a radiant heat source comprising a plurality of energy sources in optical communication with each of the plurality of light pipe structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A and 3B are a plan view and an isometric view, respectively, showing another embodiment of a light pipe array.

FIG. 5A is a schematic side cross-sectional view of another embodiment of a portion of a light pipe array that may be utilized with the lamphead assembly of FIG. 1.

FIG. 5B is an isometric view of the light pipe array of FIG. 5A.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
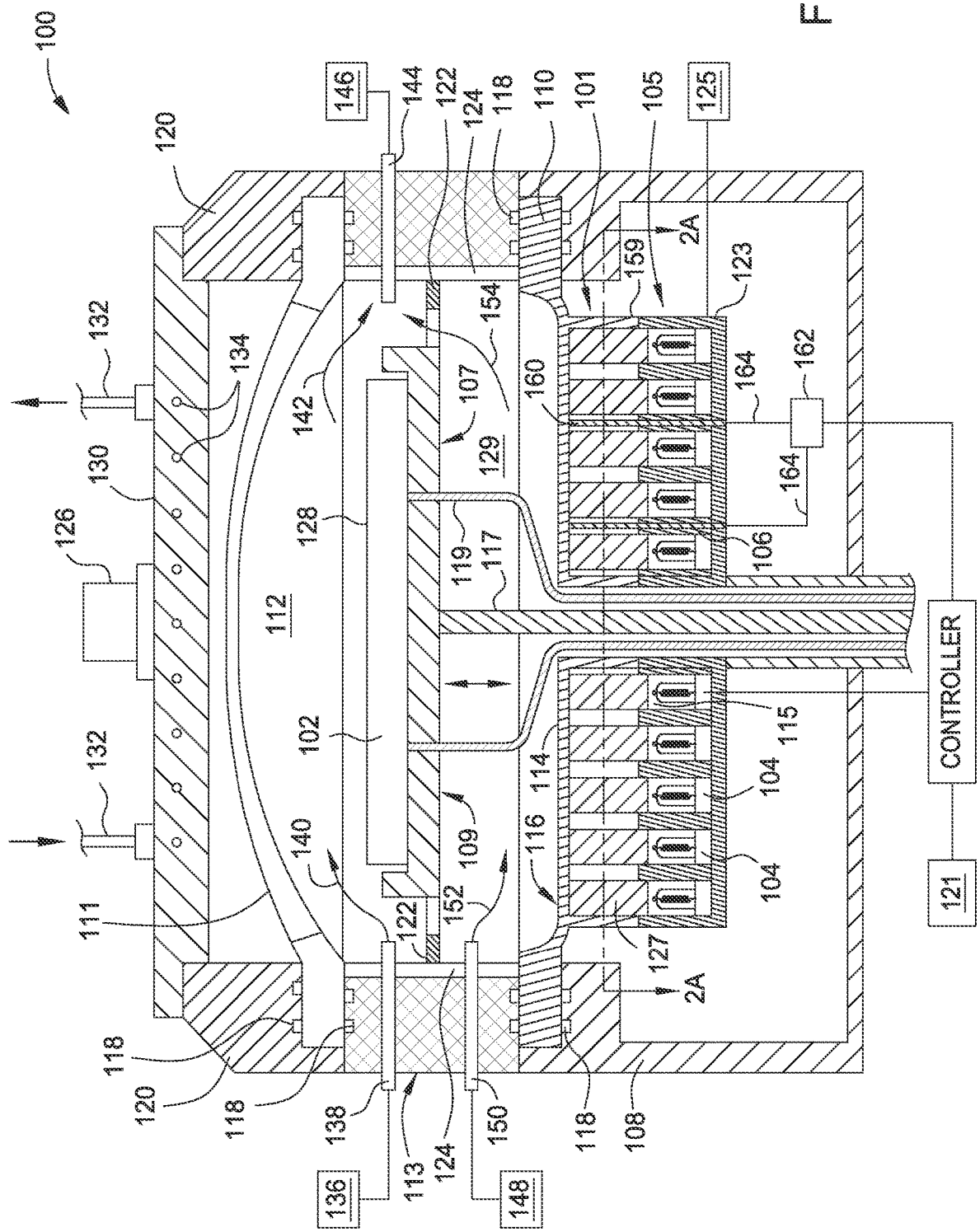
FIG. 1 illustrates a schematic sectional view of a thermal process chamber having one embodiment of the light pipe array disposed thereon.

Embodiments described herein relate to a light pipe array for a thermal processing chamber, such as deposition chambers, etch chambers, annealing chambers, implant chambers, chambers for light emitting diode formation, as well as other process chambers. The light pipe array may be utilized in process chambers available from Applied Materials, Inc. of Santa Clara, Calif., and may also be utilized in process chambers from other manufacturers as well. Any direction used herein such as "downward" or "down" as well as "upward" or "up" are based on the orientation of the chamber in the drawings as shown and may not be the actual direction in practice.

FIG. 1 illustrates a schematic sectional view of a thermal process chamber 100 having one embodiment of the light pipe array 101 disposed thereon. The thermal process chamber 100 may be used to process one or more substrates, including the deposition of a material on an upper surface of a substrate 102, annealing of a substrate, etching of a substrate, or other thermal process. While not discussed in detail herein, the deposited material may include a semiconductor material, including elemental materials such as silicon and germanium, alloy materials such as silicongermanium, and compound semiconductor materials such as gallium arsenide, gallium nitride, or aluminum gallium nitride. As described herein, the thermal process chamber 100 is adapted to receive a substrate in a "face-up" orientation, wherein the deposit receiving side or face of the substrate is oriented upward and the "backside" of the substrate is facing downward.

The thermal process chamber 100 may include a lamphead assembly 105, which includes a radiant heat source 106. The radiant heat source 106 includes an array of energy sources 104 for heating, among other components, a back side 107 of a substrate support 109 disposed within the thermal process chamber 100. The radiant heat source 106 may be disposed in a housing 123 that couples to the process chamber 100. The radiant heat source 106 also includes a plurality of light pipe structures 127 associated with the energy sources 104 of the lamphead assembly 105. Each of the plurality of light pipe structures 127 may include a columnar-shaped structure (i.e., a columnar structure) along a longitudinal axis thereof, among other shapes. The light pipe structures 127 are provided as non-metallic light pipes through which photons from the energy sources 104 of the radiant heat source 106 may pass to heat the substrate 102 during processing. In one embodiment, each of the light pipe structures 127 may have a total internal reflection (TIR) property under ordinary conditions. Each of the plurality of light pipe structures 127 may be aligned with one of the energy sources 104, as shown in FIG. 1. While the light pipe structures 127 may be configured to reflect optical energy, each of the light pipe structures 127 are made of transparent materials as opposed to metallic materials (e.g., gold (Au) and silver (Ag)) utilized as conventional reflectors.

The substrate support 109 may be a disk-like substrate support 109 as shown. Alternatively, the substrate support 109 may be a pin support (such as three or more pins which supports the substrate from the bottom thereof), or a ring-like substrate support which supports the substrate from the edge of the substrate. Regardless of the type, the substrate support 109 facilitates exposure of the substrate to the thermal radiation through the light pipe array 101. The substrate support 109 is located within the thermal process chamber 100 between an upper dome 111 and a wall member 114 of the light pipe array 101. The upper dome 111, the upper surface of the wall member 114, which may be a plate, and a base ring 113, that is disposed between the upper dome 111 and a mounting flange 110 of the light pipe array 101, generally define an internal region of the thermal process chamber 100. The substrate support 109 generally divides the internal volume of the thermal process chamber 100 into a process region 112 that is above the substrate, and a purge region 129 below the substrate support 109.

The substrate support 109 may be rotated during processing by a central shaft 117. Rotation of the substrate support 109 may be utilized to minimize the effect of thermal and process gas flow spatial anomalies within the thermal process chamber 100 and thus facilitate uniform processing of the substrate 102. The substrate support 109 is supported by the central shaft 117, which may move the substrate 102 in an upward/downward direction (i.e., vertically, as shown by arrows) during substrate transfer processes, and in some instances, processing of the substrate 102. The substrate support 109 may be formed from silicon carbide or graphite coated with silicon carbide to absorb radiant energy from the energy sources 104 and conduct the radiant energy to the substrate 102. Each of the energy sources 104 may be disposed in a tube 115 that may be made of a metallic reflective material. A plurality of lift pins 119 may be disposed in the thermal process chamber 100 outward of the central shaft 117. The lift pins 119 may be coupled to an actuator (not shown) to move the lift pins 119 vertically within the thermal process chamber 100 relative to, and independent of, the substrate support 109. The substrate 102 can be transferred into the thermal process chamber 100 and positioned onto the substrate support 109 through a loading port (not shown). The substrate support 109 is shown in an elevated processing position in FIG. 1, but may be vertically traversed by an actuator (not shown) to a loading position below the processing position to allow lift pins 119 to contact the substrate 102 and space the substrate 102 away from the substrate support 109. A robot (not shown) may then enter the process chamber 100 to engage and remove the substrate 102 therefrom though the loading port.

Typically, the upper dome 111 and the wall member 114 are formed from an optically transparent material such a quartz material, or a sapphire material as described above. In this embodiment, the wall member 114 of the light pipe array 101 includes a recessed portion 116, which may provide additional structural rigidity to the light pipe array 101. The recessed portion 116 provides a concave or a dome shape to the light pipe array 101 and may enable a thinner cross-sectional dimension of the wall member 114 which may provide structural rigidity while operating at lower pressures. In some embodiments, the light pipe array 101 includes a peripheral housing 159 disposed around the light pipe structures 127.

The wall member 114 and the light pipe structures 127 may be made from the same or different materials that are transparent to electromagnetic radiation of various wavelengths, which may include light in the visible and non-visible wavelengths, including at least wavelengths from 100 nanometers (nm) to 50 microns. In some embodiments, the electromagnetic wavelengths may be in the infra-red (IR) spectrum. In one embodiment, both of the wall member 114 and the light pipe structures 127 are made from a quartz material (i.e., amorphous silica), although other materials that are transparent to energy, such as wavelengths in the infra-red spectrum, may be used, such as glass, sapphire, and alumino-silicate glasses. The wall member 114 may be made from a clear fused quartz material having low inclusion tolerances. The term "transparent", as used herein, refers to a substance which, within its volume, does not appreciably alter the direction or the power of a selected wavelength range of electromagnetic radiation as the radiation passes through the volume. In one example, the average directional change of a selected wavelength range of electromagnetic radiation is less than a few degrees and the average power reduction is less than about 70%.

In one embodiment, the thickness of the light pipe array 101 having the wall member 114 that is planar may be about 40 mm while the thickness of the light pipe array 101 having the wall member 114 with a concave shape (e.g., the recessed portion 116 shown in FIG. 4) may be about 35 mm. At least the wall member 114 of the light pipe array 101 may be coupled to the mounting flange 110 which may be coupled between a sidewall 108 and the base ring 113. Seals 118, such as o-rings, may be used to seal the mounting flange 110 to the sidewall 108 and the base ring 113. The upper dome 111 may be coupled to the base ring 113 and a clamp ring 120 using seals 118 disposed therebetween for sealing.

The energy sources 104 may be configured to heat the substrate 102 to a temperature within a range of about 200 degrees Celsius to about 1,600 degrees Celsius. Each energy source 104 may be coupled to a power source 121 and a controller. The light pipe array 101 may be cooled during or after processing by a coolant source 125. The coolant source 125 may include a coolant such as water, ethylene glycol, nitrogen ($N_2$), helium (He), or other fluid used as a heat exchange medium. The coolant may be flowed throughout the housing 123 and in between the energy sources 104 of the radiant heat source 106. Alternatively or in addition, the lamphead assembly 105 and/or the housing 123 may be cooled convectively.

In one embodiment, a longitudinal axis of at least a portion of the light pipe structures 127 may be positioned at a substantially orthogonal angle relative to a plane of a major surface of the wall member 114. The term "substantially orthogonal" includes a normal angle (e.g., 90 degrees) as well as +/−5 degrees off-normal (e.g., 85 degrees to 95 degrees). In some embodiments, at least a portion of one or both of the light pipe structures 127 and the energy sources 104 may be angled inwardly toward a central axis of the process chamber 100. For example, the light pipe structures 127 and/or the energy sources 104 near the central shaft 117 may tilted inwardly at about 30 degrees to about 45 degrees relative to a plane of the wall member 114 to direct radiant energy toward a center region of the substrate support 109 (i.e., above the central shaft 117). In one example, radiant energy from at least a portion of the energy sources 104 pass through the wall member 114 at a non-normal angle relative to the plane of the wall member 114.

A shield 122 may be optionally disposed around the substrate support 109. The base ring 113 may also be surrounded by a liner assembly 124. The shield 122 prevents or minimizes leakage of heat/light noise from the energy sources 104 to a device side 128 of the substrate 102 while providing a pre-heat zone for the process gases. The shield 122 may be made from CVD SiC, sintered graphite coated with SiC, grown SiC, opaque quartz, coated quartz, or any similar, suitable material that is resistant to chemical breakdown by process and purging gases. The liner assembly 124 is sized to be nested within or surrounded by an inner circumference of the base ring 113. The liner assembly 124 shields the processing volume (i.e., the process region 112 and purge region 129) from metallic walls of the process chamber 100. The metallic walls may react with precursors and cause contamination in the processing volume. While the liner assembly 124 is shown as a single body, the liner assembly 124 may include one or more liners.

The thermal process chamber 100 may also include a thermal sensor 126, which may be a pyrometer, for temperature measurement/control on the substrate 102. The temperature measurement by the thermal sensor 126 may be performed on the device side 128 of the substrate 102. As a result, the thermal sensor 126 may only sense radiation from the hot substrate 102, with minimal background radiation from the energy sources 104 directly reaching the thermal sensor 126. A reflector 130 may be optionally placed outside the upper dome 111 to reflect light that is radiating off the substrate 102 back onto the substrate 102. The reflector 130 may be secured to a clamp ring 120. The reflector 130 can be made of a metal such as aluminum or stainless steel. The efficiency of the reflection can be improved by providing a highly reflective coating layer such as gold (Au). The reflector 130 can have one or more ports 132 connected to a cooling source (not shown). The ports 132 may be connected to a passage 134 formed in or on the reflector 130. The passage 134 is configured to flow a fluid such as water or a gas, such as helium, nitrogen or other gas to cool the reflector 130.

In some embodiments, the light pipe array 101 may include one or more metrology light pipes 160 formed in, or disposed through, at least a portion of the light pipe array 101. The metrology light pipes 160 may comprise sapphire or other transparent material as described herein. The metrology light pipes 160 are utilized to couple with a sensor 162, such as an optical pyrometer, via an optional fiber optic cable 164, in one embodiment. The metrology light pipes 160 may have a diameter of about 1 mm to about 2 mm and are configured to be positioned between at least a portion of the light pipe structures 127. The metrology light pipes 160 may have a length that extends from a surface of the wall member 114 to an end thereof disposed below the housing 123 of the lamphead assembly 105. Having one or more metrology light pipes 160, such as an array of metrology light pipes 160, at specific radial positions or zones within the light pipe array 101 just below the wall member 114, allows for temperature sensing at a position that is significantly closer to the plane of the substrate support 109 and/or the substrate 102. The proximity of the metrology light pipes 160 to the substrate support 109 and/or the substrate 102 allows for a smaller measurement site, which enables finer temperature control.

Process gas may be supplied from a process gas source 136 is introduced into the process region 112 through a process gas inlet 138 formed in the sidewall of the base ring 113. The process gas inlet 138 is configured to direct the process gas in a generally radially inward direction. During a film formation process, the substrate support 109 may be located in the processing position, which is adjacent to and at about the same elevation as the process gas inlet 138, allowing the process gas to flow up and round along flow path 140 across the upper surface of the substrate 102 in a laminar flow regime. The process gas exits the process region 112 (along flow path 142) through a gas outlet 144 located on the side of the process chamber 100 opposite the process gas inlet 138. Removal of the process gas through the gas outlet 144 may be facilitated by a vacuum pump 146 coupled thereto. As the process gas inlet 138 and the gas outlet 144 are aligned to each other and disposed approximately at the same elevation, it is believed that such a parallel arrangement, when combined with the upper dome 111, will enable a generally planar, uniform gas flow across the substrate 102. Further radial uniformity may be provided by the rotation of the substrate 102 through the substrate support 109.

A purge gas may be supplied from a purge gas source 148 to the purge region 129 through an optional purge gas inlet 150 formed in the sidewall of the base ring 113. The purge gas inlet 150 is disposed at an elevation below the process gas inlet 138. If the circular shield 122 or a pre-heat ring (not shown) is used, the circular shield or the pre-heat ring may be disposed between the process gas inlet 138 and the purge gas inlet 150. In either case, the purge gas inlet 150 is configured to direct the purge gas in a generally radially inward direction. During a film formation process, the substrate support 109 may be located at a position such that the purge gas flows down and round along flow path 152 across the back side 107 of the substrate support 109 in a laminar flow regime. Without being bound by any particular theory, the flowing of the purge gas is believed to prevent or substantially avoid the flow of the process gas from entering into the purge region 129, or to reduce diffusion of the process gas entering the purge region 129 (i.e., the region under the substrate support 109). The purge gas exits the purge region 129 (along flow path 154) and is exhausted out of the process chamber through the gas outlet 144, which is located on the side of the process chamber 100 opposite the purge gas inlet 150.

Similarly, during the purging process, the substrate support 109 may be located in an elevated position to allow the purge gas to flow laterally across the back side 107 of the substrate support 109. It should be appreciated by those of ordinary skill in the art that the process gas inlet, the purge gas inlet and the gas outlet are shown for illustrative purpose, since the position, size, or number of gas inlets or outlet etc. may be adjusted to further facilitate a uniform deposition of material on the substrate 102. Another option may be to provide a purge gas through the process gas inlet 138. If desired, the purge gas inlet 150 may be configured to direct the purge gas in an upward direction to confine process gases in the process region 112.

Figure 2A:
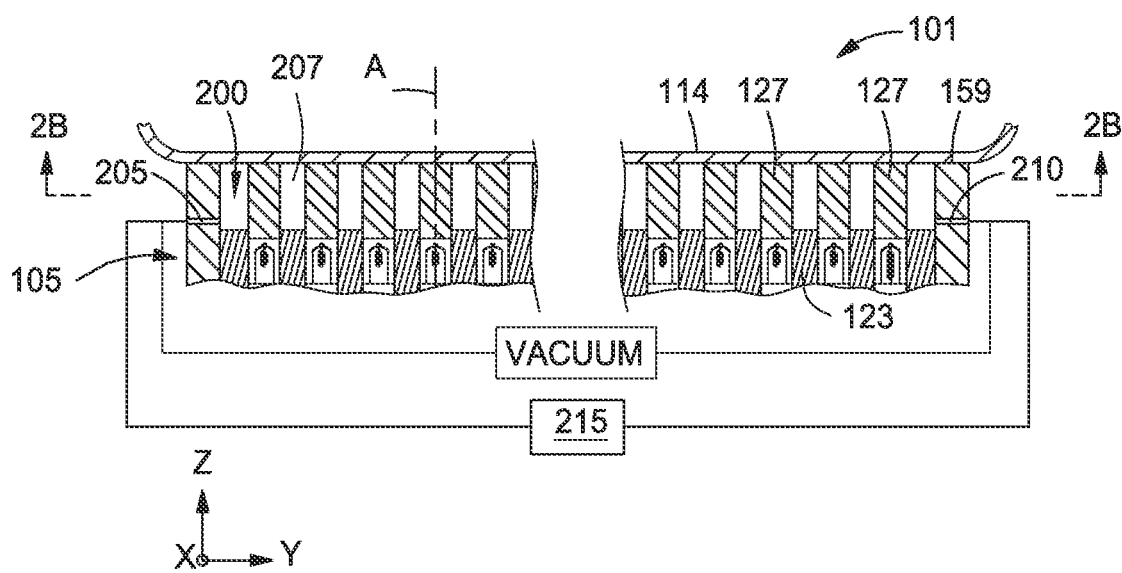
FIG. 2A is a cross-sectional view of the light pipe array across section lines 2B-2B of FIG. 1.
Figure 2B:
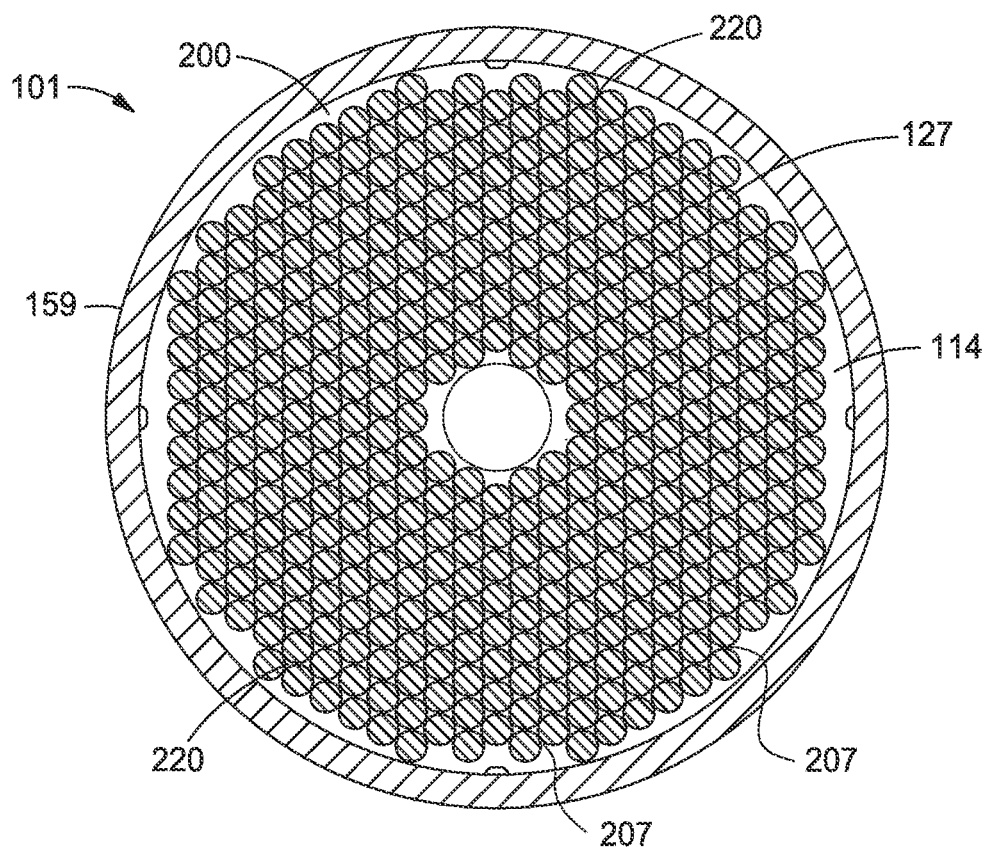
FIG. 2B is a cross-sectional view of the light pipe array across section lines 2B-2B of FIG. 2A.

FIGS. 2A and 2B are cross-sectional views showing one embodiment of the light pipe array 101 that may be utilized in the thermal process chamber 100 of FIG. 1. FIG. 2A is a cross-sectional view of the light pipe array 101 across section lines 2B-2B of FIG. 1. FIG. 2B is a cross-sectional view of the light pipe array 101 across section lines 2B-2B of FIG. 2A. The lift pins 119 and the shaft 117, as well as the metrology light pipes 160 shown in FIG. 1, are not shown in FIGS. 2A and 2B. The light pipe array 101 may be coupled to the lamphead assembly 105 (a portion of which is shown in FIG. 2A).

The light pipe array 101 in this embodiment includes the peripheral housing 159, the wall member 114 and the light pipe structures 127 sandwiched between the wall member 114 and the lamphead assembly 105. The wall member 114 may be made from an optically transparent material, such as quartz or sapphire. Likewise, the peripheral housing 159 may be made from an optically transparent material such as quartz. The term "optically transparent" as used herein is the ability of the material to transmit radiation, for example light waves or other wavelengths used for heating other objects and, in particular, wavelengths in the visible spectrum as well as non-visible wavelengths, such as in the infra-red (IR) spectrum. The wall member 114 may be joined to the light pipe structures 127 by a diffusion welding process or other suitable joining method in one embodiment. Each of the light pipe structures 127 may be a solid structure, such as a rod made from an optically transparent material, for example the same material as the wall member 114 (i.e., fused quartz or sapphire). While not shown, the light pipe structures 127 may be a hollow-type light pipe where a hollow core is surrounded by reflective walls having a cross-sectional shape similar to a cross-section of a circular tubular, a hexagonal tubular, or other polygonal tubular.

The cross-section of the light pipe structures 127 may include a circular shape in plan view (i.e., a circular cross-section) as shown in FIG. 2B. However, the light pipe structures 127 may be formed in rectangular shapes, triangular shapes, diamond shapes, or combinations thereof, or other polygonal and/or irregular shapes in plan view. The light pipe structures 127 may be columnar in elevation view. In elevation view, each of the light pipe structures 127 may include sides that are substantially parallel to each other as shown in FIG. 2A, or sides that converge or diverge such that a cone shape is formed in elevation view.

As shown in FIG. 2A, each of the light pipe structures 127 include a longitudinal axis A that is substantially perpendicular to a plane of a major surface of the wall member 114. When the wall member 114 is coupled to the peripheral housing 159 and the lamphead assembly 105, a sealed internal volume 200 may be contained within the interior sidewalls of the peripheral housing 159, as well as in voids 207 between the light pipe structures 127, the wall member 114 and the housing 123 of the lamphead assembly 105. In some embodiments, the peripheral housing 159 may include an inlet port 205 and an outlet port 210. The inlet port 205 and the outlet port 210 may be coupled to a coolant source 215 which circulates a fluid through the sealed internal volume 200 as well as voids 207 between light pipe structures 127 in order to cool the light pipe array 101. The fluid may be water, ethylene glycol, nitrogen ($N_2$), helium (He), or other fluid used as a heat exchange medium. Small gaps 220 (shown in FIG. 2B) provide flow of the fluid around the light pipe structures 127 to facilitate cooling of each of the light pipe structures 127. In addition, or as an alternative, to flowing cooling fluid through the inlet port 205 and the outlet port 210, one or both of the inlet port 205 and the outlet port 210 may be coupled to a vacuum pump (shown in FIG. 2A) in order to provide a low pressure to the sealed internal volume 200, and the voids 207 and gaps 220 between the light pipe structures 127. The vacuum pump may be utilized to reduce the pressure in the sealed internal volume 200 and voids 207 which may provide reduction of a pressure gradient between the interior volume of the thermal process chamber 100 and the sealed internal volume 200.

FIGS. 3A and 3B are a plan view and an isometric view, respectively, showing another embodiment of a light pipe array 300. The light pipe array 300 includes a plurality of light pipe structures 127 and may be utilized with the lamphead assembly 105 of FIG. 1. A central opening for the lift pins 119 and the shaft 117 of FIG. 1 are not shown on FIGS. 3A and 3B. The light pipe structures 127 of the light pipe array 300 according to this embodiment are hexagonal in plan view (i.e., a hexagonal cross-section). In some embodiments, the shape of the light pipe structures may be mixed, such as a mixture of hexagonally-shaped light pipe structures 127 with circular-shaped light pipe structures 127, among other shapes and combinations.

Each of the light pipe structures 127 may be a prism that smoothes light from the energy sources 104 (shown in FIG. 1) thus improving radiance distribution of energy from the energy sources 104. The term "prism" as used herein can be defined as a transparent solid columnar body having a polygonal cross section (for example, the light pipe structures as shown in FIGS. 3A-5B). The light pipe structures 127 may be coupled to the wall member 114, placed in proximity to, or be in contact with wall member 114. Alternatively, the light pipe structures 127 may be integral to the wall member 114.

One method to form the light pipe array 101 includes milling a block of an optically transparent material to produce the light pipe structures 127. A plate of optically transparent material may be precision milled at specific angles and depths to produce light pipe structures 127 having polygonal shapes in cross-section as discussed above. The kerf may be utilized to form voids surrounding the light pipe structures 127. Forming the light pipe structures 127 to a specific depth in the material makes the wall member 114 integral with the light pipe structures 127. Another transparent plate may be joined to the light pipe structures 127 by a joining process, such as ceramic solder techniques, seal glass bonding, a diffusion welding process or other suitable joining method. When rods of optically transparent material of a specific shape are used for the light pipe structures 127, the light pipe structures 127 may be joined to the wall member 114 by a joining process, such as ceramic solder techniques, seal glass bonding, a diffusion welding process or other suitable joining method.

The close-packed arrangement of light pipe structures 127 are sized and spaced to substantially axially align with each of the tubes 115 of the radiant heat source 106 (shown in FIG. 1) in one embodiment. However, some misalignment between the tubes 115 and the light pipe structures 127 may also be utilized to provide a high-power density and good spatial resolution. Further, the irradiance pattern in some conventional lampheads is irregular, which may be due to manufacturing variations in the lamps. However, in some embodiments, the light pipe structures 127 of the light pipe array 101 may also produce a smoother irradiance pattern at the target plane (i.e., the surface of the substrate that is heated), thus making the lamphead assembly 105 less dependent on lamp-to-lamp manufacturing differences due to mixing within the light pipe structures 127.

Figure 4B:
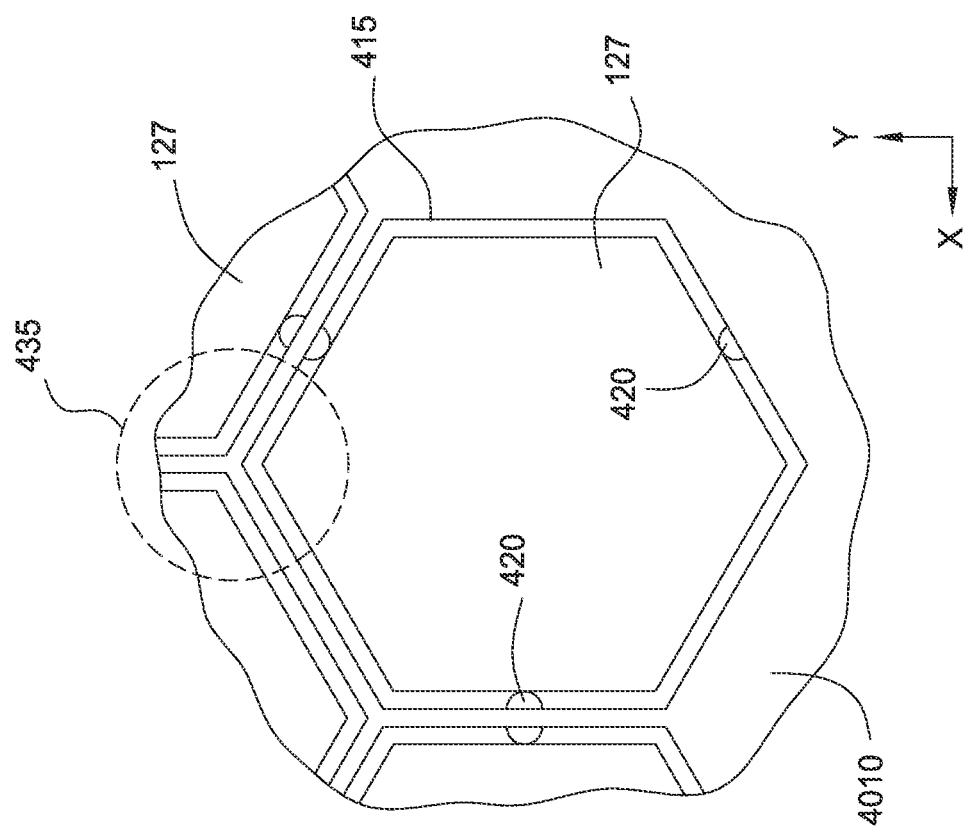
FIG. 4B is an enlarged top view of a portion of the light pipe array of FIG. 4A.
Figure 4A:
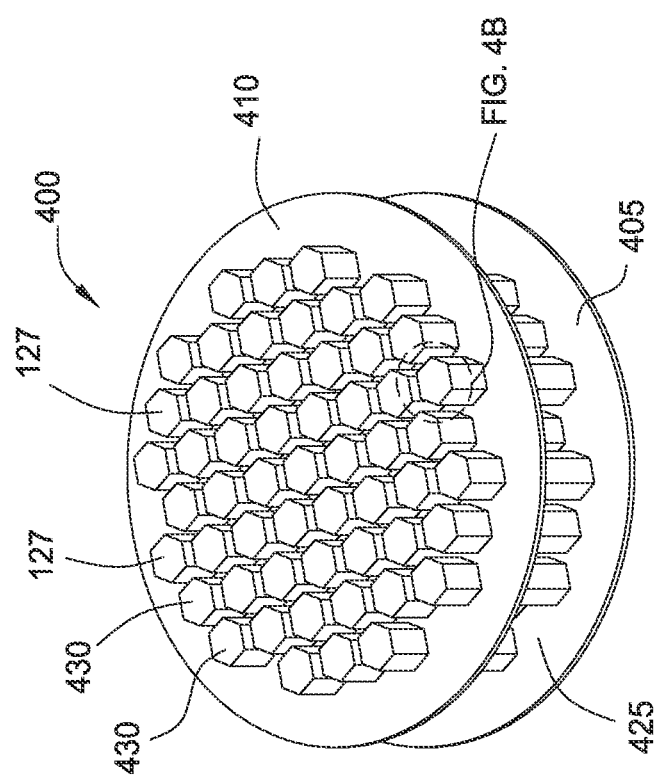
FIG. 4A is an isometric view of another embodiment of a light pipe array that may be utilized with the lamphead assembly of FIG. 1.

FIG. 4A is an isometric view of another embodiment of a light pipe array 400 that may be utilized with the lamphead assembly 105 of FIG. 1. FIG. 4B is an enlarged top view of a portion of the light pipe array 400 of FIG. 4A. A central opening for the lift pins 119 and the shaft 117 of FIG. 1 are not shown on FIGS. 4A and 4B. In this embodiment, a plurality of light pipe structures 127 are coupled to a wall member 405, which may be similar to the wall member 114 being a first plate, and a second plate 410. The second plate 410 may include perforations 415 where one of the light pipe structures 127 may be inserted therethrough. Alternately, the second plate 410 and the light pipe structures 127 may be formed integrally, or the light pipe structures 127 may be coupled to opposite sides of the second plate 410.

The perforations 415 may include one or more contact members 420 that project inwardly and contact a portion of the light pipe structures 127. The contact members 420 may be used to space the light pipe structures 127 away from the second plate 410. The second plate 410 may be made of a metallic material, a heat resistant plastic material, or a ceramic material. The perforations 415 and the contact members 420 may be formed by stamping or molding when forming the second plate 410.

In some embodiments, the wall member 405 also includes perforations similar to the perforations 415 formed in the second plate 410, and the wall member 405 may be made of the same materials as the second plate 410. Thus, one or both of the wall member 405 and the second plate 410 may function as an indexing plate that aligns and fixes individual light pipe structures 127 in an array 425. The array 425 may then be installed on the lamphead assembly 105 (shown in FIG. 1) such that a surface 430 of the light pipe structures 127 may be in proximity to, or in contact with, the wall member 114 (shown in FIG. 1). In this embodiment, the light pipe structures 127 are hexagonally shaped in plan view, but may have other shapes that enable a close-packed array. Other shapes include conical, non-regular pentagonal, triangular, square or diamond-shaped. Tests have concluded that the close-packed array of light pipe structures 127 provides more radiation in corner regions 435 of adjacent light pipe structures 127 as opposed to the radiation patterns of circular shaped light pipe structures.

FIG. 5A is a schematic side cross-sectional view of another embodiment of a portion of a light pipe array 500 that may be utilized with the lamphead assembly 105 of FIG. 1. FIG. 5B is an isometric view of the light pipe array 500. The light pipe array 500 includes a plurality of light pipe structures 127 (only one is shown in FIGS. 5A and 5B) that mount on a tube 115 of the lamphead assembly 105. The light pipe structures 127 include an interface 505 (i.e., an interface portion) having a cross-sectional dimension (i.e., diameter) that may be inserted at least partially into the tube 115. For example, the interface 505 may be recessed to a position within the tube 115 of the lamphead assembly 105. The cross-sectional dimension of the interface 505 is less than a cross-sectional dimension of the remainder of the light pipe structure 127, in one embodiment. The surface 430 may be placed in proximity to, or in contact with, the wall member 114 when installed in the thermal process chamber 100 of FIG. 1. In one embodiment, the light pipe structure 127 includes a height H of about 40 mm and the interface 505 may have a length L of about 0.5 mm. Depending on the lamp and reflector tube 115, the radiance pattern provided by the light pipe structure 127 can range from almost perfectly Gaussian to a more peaked center beam or a more flattened profile.

While the light pipe structure 127 is shown as a hexagonal shape, the light pipe structure 127 may have other polygonal shapes, as well as having a circular shape. However, having a light pipe structure 127 with sharp corners 510 reduces gaps in the irradiance pattern (i.e., provides more irradiance in corner regions 435 (shown in FIG. 4) as opposed to the radiation patterns of circular shaped light pipe structures). In some embodiments, the energy sources 104 (only one is shown in FIG. 5A) include a filament 515 and a lead 520, and the lead 520 may cause a shadow. The shadow is sometime noticeable in the irradiance pattern. However, utilization of a light pipe structure 127 with one or more sides 525 reduces the shadow significantly. Increasing the quantity of sides also reduces azimuthal irregularities. In some embodiments, a lower surface of the light pipe structure 127 may have a contoured surface 530 to alter distribution of light into the body of the light pipe structure 127. For example, the contoured surface 530 may function as a lens. The contoured surface 530 may be used to direct light at an angle relative to a longitudinal axis of the light pipe structure 127. For example, the contoured surface 530 may be used to direct light toward a center of the thermal process chamber 100 of FIG. 1.

Figure 6:
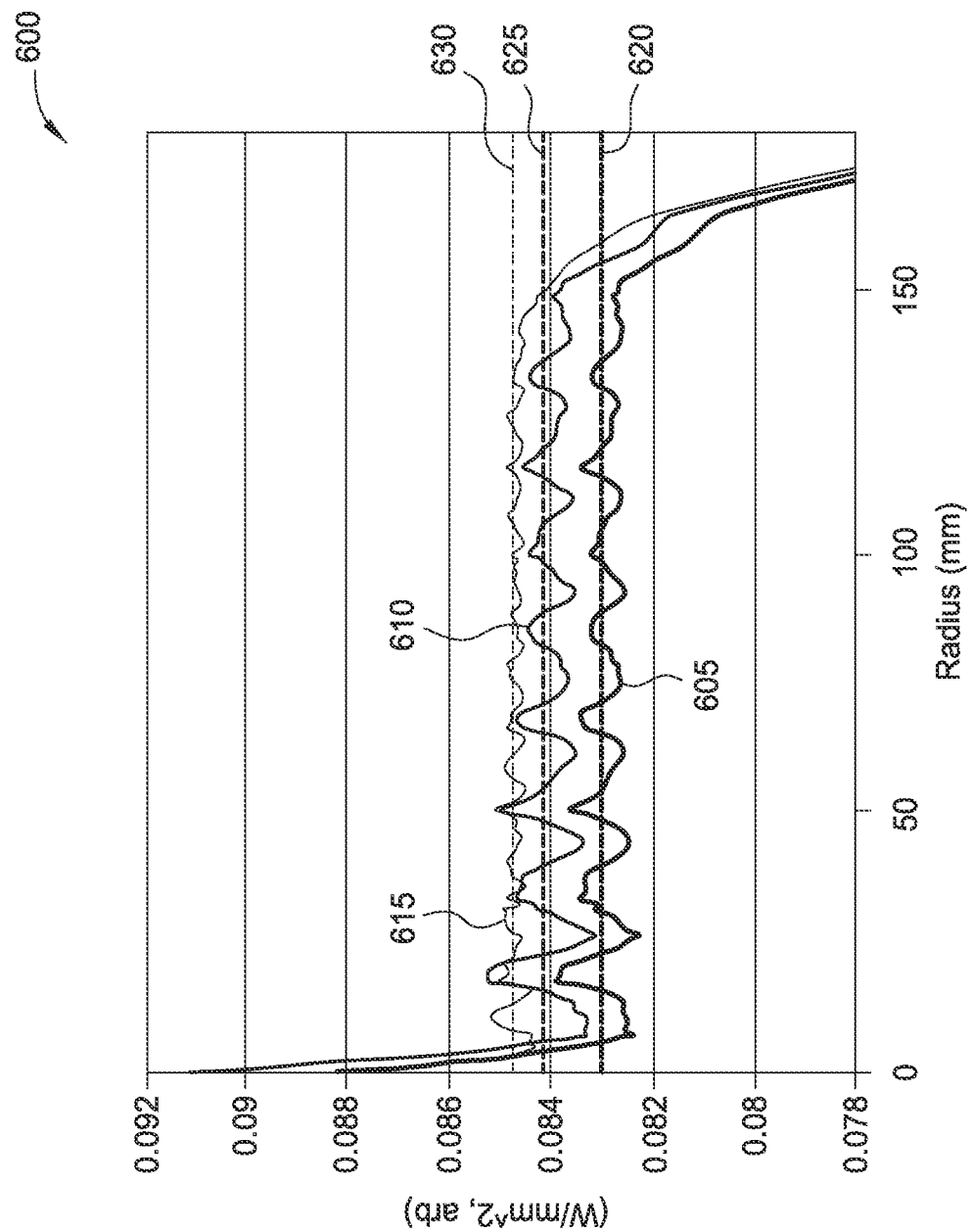
FIG. 6 is a graph showing irradiance curves from a lamp array at different radial locations on a substrate.

FIG. 6 is a graph 600 showing irradiance curves from a hexagonal close packed lamp array at different radial locations on a substrate. The lamp array included multiple energy sources, such as the energy sources 104 described herein, and was simulated using no light pipe structures (curve 605), and cylindrical light pipe structures (curve 610), hexagonal light pipe structures (curve 615). Straight dashed lines 620, 625 and 630 in the center of the graph indicate an average of no light pipes, an average of the cylindrical light pipes, and an average of hexagonal light pipe structures, respectively.

When equal power was supplied to all of the energy sources in the lamp array, irradiance values were on the average greater than irradiance values in the absence of light pipe structures (curve 605) and the cylindrical light pipe structures (curve 610). In addition, the irradiance pattern was much smoother than either of the curves 605 and 610.

Other simulations were performed in a thermal process chamber similar to the thermal process chamber 100 of FIG. 1 having a heat source similar to the radiant heat source 106 coupled thereto, with the exception being the heat source was disposed in an upper part of the chamber. For example, in reference to FIG. 1, the positions of the radiant heat source 106 and the upper dome 111 would be switched such that the radiant heat source 106 would face the device side 128 of the substrate 102. A wall member 114 may be disposed between the radiant heat source 106 and the substrate 102. The radiant heat source 106 having the energy sources 104 in this configuration would function as a lamp array for results shown in the graph 700 shown in FIG. 7.

Figure 7:
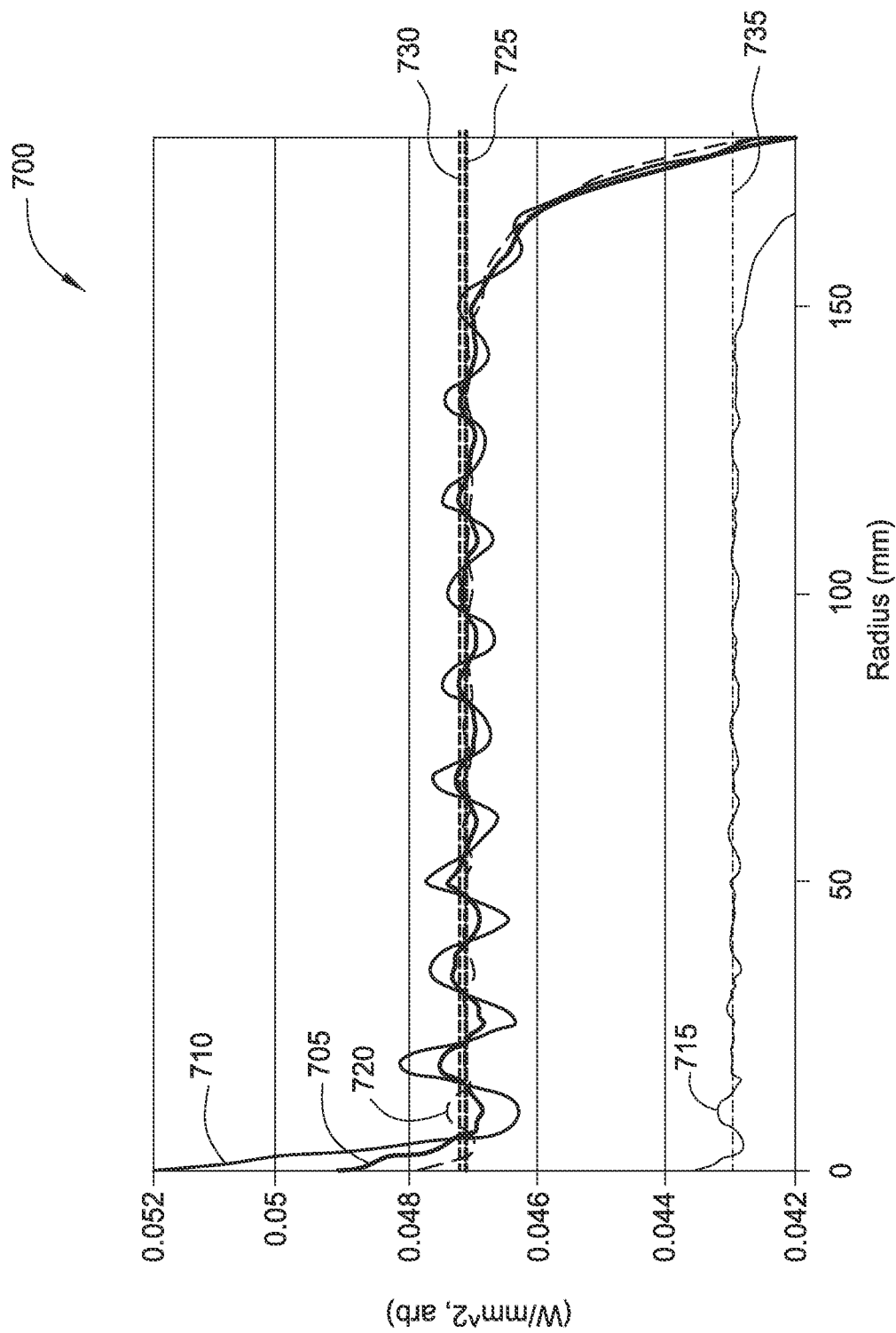
FIG. 7 is a graph showing irradiance curves from a lamp array at different radial locations on a substrate.

FIG. 7 is a graph 700 showing irradiance curves from a lamp array at different radial locations on a substrate. The lamp array was tested using no light pipe structures (curve 705), and cylindrical light pipe structures (curve 710), hexagonal light pipe structures (curve 715). Straight dashed lines 725 and 730 in the center of the graph indicate an average of no light pipes, and an average of the cylindrical light pipes, respectively. Straight dashed line 735 near the bottom of the graph 700 indicates an average of hexagonal light pipe structures. Curve 720 is line 735 scaled for easier comparison with the other curves.

When equal power was supplied to all of the energy sources in the lamp array, irradiance values were greater in the absence of light pipe structures (curve 605) and the cylindrical light pipe structures (curve 610) as compared to the irradiance value of the hexagonal light pipe structures (curve 615). However, the irradiance pattern of the hexagonal light pipe structures was much smoother as compared to the cylindrical light pipe structures and no light pipe structures.

Utilization of the light pipe arrays 101, 300, 400 and 500 as described herein allows a lamphead assembly 105 (shown in FIGS. 1 and 2) to be disposed outside of the chamber interior volume. In some embodiments, the wall member 114 of the light pipe arrays 101, 300, 400 and 500 as described herein provide a process chamber boundary (e.g., a boundary of the interior volume where processing occurs). Seals, such as o-rings and the like, may be utilized to seal the chamber interior volume and allow the lamphead assembly 105 to be positioned external to the interior volume. Utilization of the light pipe arrays 101, 300, 400 and 500 as described herein provides enhanced intensity and/or improves the radiance pattern of the energy sources 104 (shown in FIGS. 1 and 5A).

While the foregoing is directed to specific embodiments, other and further embodiments may be devised without departing from the basic scope thereof, and the scope thereof is determined by the claims that follow.

The invention claimed is:

1. A light pipe array for use in a thermal process chamber, the light pipe array comprising:
    a wall member comprising an optically transparent material; and
    a plurality of non-metallic light pipe structures disposed adjacent to a major surface of the wall member, each of the plurality of light pipe structures having a longitudinal axis, at least a portion of the plurality of light pipe structures comprising a prism and being positioned with the longitudinal axis in a substantially orthogonal relation to a plane of the major surface of the wall member.

2. The light pipe array of claim 1, wherein each of the plurality of light pipe structures comprise a transparent material.

3. The light pipe array of claim 1, further comprising one or more plates securing each of the plurality of light pipe structures.

4. The light pipe array of claim 1, wherein the one or more plates have perforations formed there through, each perforation having one of the light pipe structures disposed therein.

5. The light pipe array of claim 1, further comprising a radiant heat source coupled to the light pipe array, wherein each of the plurality of light pipe structures has an interface portion that couples with a tube of the radiant heat source.

6. The light pipe array of claim 1, wherein each of the plurality of light pipe structures is coupled to the wall member.

7. The light pipe array of claim 1, wherein each of the plurality of light pipe structures comprises a columnar structure.

8. The light pipe array of claim 7, wherein each columnar structure comprises a solid structure having a circular cross-section.

9. The light pipe array of claim 7, wherein each columnar structure comprises a solid structure having a hexagonal cross-section.

10. The light pipe array of claim 1, wherein at least a portion of the plurality of light pipe structures are angled relative to the plane of the major surface of the wall member.

11. A process chamber, comprising:
    a chamber having an interior volume;
    a radiant heat source comprising a plurality of energy sources;
    a wall member coupled between the radiant heat source and the chamber, the wall member comprising an optically transparent material; and
    a light pipe array positioned between the chamber and the radiant heat source, the light pipe array comprising a plurality of light pipe structures comprising a prism, each of the plurality of light pipe structures being in optical communication with a respective energy source, wherein each of the plurality of light pipe structures contacts the wall member.

12. The process chamber of claim 11, further comprising one or more plates disposed in a substantially parallel relation to the wall member.

13. The process chamber of claim 12, wherein the one or more plates have perforations formed therein that secure each of the plurality of light pipe structures.

14. The process chamber of claim 11, wherein each of the plurality of light pipe structures has an interface portion that couples with a tube of the radiant heat source.

15. The process chamber of claim 11, wherein each of the plurality of light pipe structures comprises a columnar structure.

16. The process chamber of claim 15, wherein each columnar structure comprises a solid structure having a circular cross-section.

17. The process chamber of claim 15, wherein each columnar structure comprises a solid structure having a hexagonal cross-section.

18. A process chamber, comprising:
    a chamber having an interior volume;
    a light pipe array coupled to the chamber, the light pipe array comprising:
        a wall member comprising an optically transparent material;
        a plurality of light pipe structures disposed adjacent to a major surface of the wall member, each of the plurality of light pipe structures comprising a prism and having a longitudinal axis, at least a portion of the plurality of light pipe structures being positioned with the longitudinal axis in a substantially orthogonal relation to a plane of the major surface of the wall member and contacting the wall member; and a radiant heat source comprising a plurality of energy sources, each energy source in optical communication with one or more of the plurality of light pipe structures, wherein each of the plurality of light pipe structures are positioned between the wall member and the radiant heat source.

19. The process chamber of claim 18, wherein at least a portion of the plurality of light pipe structures are angled relative to the plane of the major surface of the wall member.

* * * * *